INTEGRATED ARRANGEMENT FOR INTEGRATED CIRCUIT STRUCTURES

Filed Aug. 2, 1967

INVENTOR
LUKE DILLON, JR.

BY H. Christoffersen
ATTORNEY

United States Patent Office 3,473,094

Patented Oct. 14, 1969

3,473,094

INTEGRATED ARRANGEMENT FOR INTEGRATED CIRCUIT STRUCTURES

Luke Dillon, Jr., Marlton, N.J., assignor to RCA Corporation, a corporation of Delaware Filed Aug. 2, 1967, Ser. No. 657,912
Int. Cl. H01l *11/00*
U.S. Cl. 317—235 3 Claims

ABSTRACT OF THE DISCLOSURE

An arrangement for a large scale integrated structure or chip is described. The arrangement includes a P–MOS device associated with each of several connecting bonding pads. The P–MOS device includes one diffused P-region which extends across the signal interconnect runway for testing and coupling purposes.

CROSS REFERENCE

A patent application, Ser. No. 648,449 entitled, LSI Array and Standard Cells, filed on June 23, 1967 by Thomas R. Mayhew, now Patent 3,365,707, and assigned to the present assignee describes an LSI array and standard cells which may be employed in the present invention.

BACKGROUND REFERENCE

An article entitled, "The Surface-Controlled Avalanche Transistor," IEE Wescon Technical Papers, volume 8, part 3, N12.1, 1964, describes surface-controlled avalanche transistors.

BACKGROUND OF INVENTION

Large scale integrated (LSI) structures generally include an array of circuit components located centrally in a supportable fashion on a substrate surface with bonding pads located at the periphery of the surface. The topological arrangement for some LSI structures, such as the universal or standard cell coordinate array, includes interconnect spaces or runways between the bonding pads and the cell array, as well as between adjacent cell rows in order to facilitate a coordinate functional interconnect pattern on a multi-layer basis. The runways extend across the surface parallel to the cell rows (horizontal direction) whereby a top-most connector layer may extend in the horizontal direction and a bottom-most connector layer may extend in the vertical direction. The top and bottom connector layers are separated by an insulating layer having access apertures therethrough at selective crossing points in order to provide connections between the layers.

The present invention relates generally to LSI structures or chips employing insulated gate field-effect transistors (IGFET's) and in particular to input/output (I/O) arrangements which make efficient use of space or area on the substrate.

In LSI structures employing IGFET's, known I/O arrangements are generally operable to provide I/O signal connections between the bonding pads and the component array and to additionally provide the IGFET gate insulators with protection from accumulated static charge. The I/O signal connections are implemented by diffused region connectors which extend in the bottom connector layer from the bonding pads under the runways to the component array. The protective function is achieved by additionally providing adjacent the bonding pads a surface-controlled avalanche transistor (SCAT) to prevent large static voltage build-ups from being applied to the gates of the array IGFET's. Thus, an external input signal is connected via a bonding pad, the protective SCAT and a diffused region connector to the gate of an array IGFET.

In some applications, notably dynamic or multi-phase clocked logic systems, the input signal to the LSI chip is required to be sampled or clocked. In known LSI structures, this sampling is achieved by using an inverter and/or a transmission device in the component array. This technique is undesirable because it commits an inverter and/or a transmission device in the array and it further introduces a delay of one IGFET device as well as a signal inversion.

BRIEF SUMMARY OF INVENTION

The present invention provides an I/O arrangement for an LSI chip which takes the form of a single IGFET having a pair of spaced apart diffused regions flexibly providing the static voltage protection function, the I/O connector function and the input signal sampling function. One of the diffused regions is elongated to extend across and under the runway between the component array and the bonding pad. The other of the diffused regions is spaced apart from the end of the elongated region adjacent the component array. The elongated diffused region is therefore adaptable as an I/O connector between the bonding pad and the component array. When it is desired to sample an input signal, the diffused region pair is adapted for operation as a transmission device with appropriate clocking signal being applied to a gate metal overlying and insulating from the conduction channel between the two regions. In any case where the elongated diffused region is employed as an input signal connector, the gate insulator and metal provide surface-controlled avalanche non-destructive breakdown protection for the gate insulators of the IGFET array.

DETAILED DESCRIPTION

The present invention may be practiced with any desired conductivity type insulated gate field-effect devices which share a common substrate of a suitable material such as glass, sapphire, semiconductor material, and the like. However, by way of example and completeness of the description, the invention is illustrated with insulated gate field-effect devices of the metal oxide semiconductor (MOS) variety of P-type conductivity (P–MOS). It is noted at this point that the semiconductor material can be any suitable material which is generally employed to make insulated gate field-effect devices in the semiconductor art. For the purpose of the description which follows, all semiconductor materials will be assumed to be silicon unless otherwise specified.

Figure 1:
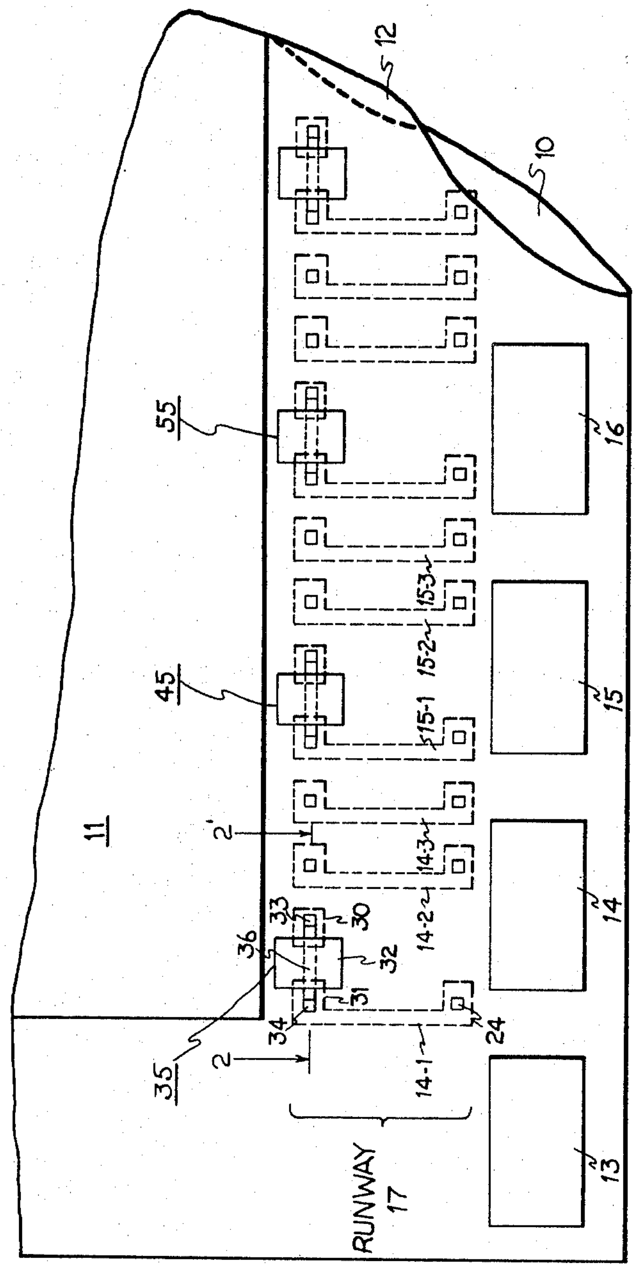
FIG. 1 is a top view of a portion of an LSI structure or chip illustrating an I/O arrangement in accordance with the invention.

Referring now to FIG. 1, there is illustrated a portion of a large scale integrated (LSI) structure or chip. As used herein, LSI technology refers to the manufacturing capability of fabricating more and more circuit components in or on the same chip or substrate whereby the electronic functional complexity on the chip approaches the system or subsystem level as distinguished from more elemental functional units such as logic gates, amplifiers and the like.

The LSI chip includes an N-type semiconductor substrate 10 which supports a component array indicated generally at 11. The component array, by way of example, includes a plurality of spaced apart diffused regions of P-type semiconductor material, some of which are arranged as IGFET's and others of which are arranged as diffused region connectors. For the sake of convenience, the component array has not been illustrated in detail. Overlying the substrate 10 is a layer 12 of insulating material, such as silicon dioxide.

The I/O arrangement for the LSI chip includes a plurality of bonding pads 13, 14, 15 and 16 which overlie the insulating layer 12 and which are located along the bottom edge of the LSI chip. Although only four pads have been illustrated, it is understood that more such pads may be located at the periphery (including the vertical sides of the chip). The bonding pads may be in the form of metal, such as aluminum.

The bonding pads provide input and output terminal connections to external signal source and load means. By way of example, the pad 13 might be used as a ground reference; while the pads 14, 15 and 16 may be used as I/O pads.

The space between the bonding pads and the component array 11 is an interconnect space or runway 17. Extending under the runway 17 is a plurality of spaced apart elongated regions of P-type material diffused in the N-type substrate 10. For example, the diffused P-regions 14–1, 14–2 and 14–3 extend across runway 17 in the vicinity of pad 14; while P-regions 15–1, 15–2 and 15–3 extend across the runway in the vicinity of pad 15. Extending through the insulating layer 12 is a plurality of access apertures or holes positioned over each end of the elongated P-regions to expose the end portions thereof. For example, access apertures 24 and 34 are positioned over the ends of the P-regions 14–1.

In prior art LSI chips, additional P-regions are located adjacent separate ones of the bonding pads 14, 15 and 16. Surface-controlled avalanche transistors (SCAT's) are formed with each of these P-regions by providing a thin oxide layer and a metal electrode over the P-N junction forming edges of the regions.

In accordance with the I/O arrangement of the present invention, one of the elongated P-regions adjacent an I/O pad forms one of the spaced apart P-regions of a P-MOS device. The P-MOS device affords not only the protective avalanche transistor feature but also an I/O connector function as well. Moreover, the P–MOS device is available for use as a transmission gate for input signal sampling, thereby obviating the need for using an inverter and transmission gate in the component array 11 for this purpose.

Thus, there is shown in FIG. 1, P–MOS devices 35, 45 and 55 associated with I/O pads 14, 15 and 16, respectively. Since each of these P–MOS devices is substantially identical, only the P–MOS devices 35 will be described in detail.

Figure 2:
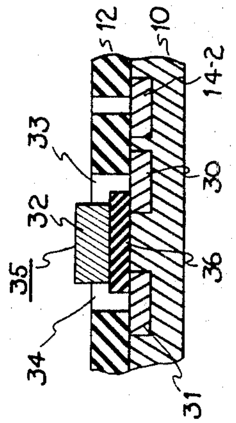
FIG. 2 is a sectional view taken along the line 2–2′ in FIG. 1.

Referring now to both FIGS. 1 and 2, the P–MOS device 35 has a diffused P-region 30 located adjacent the component array 11 in spaced apart relation with the end 31 of P-region 14–1. The P-region 30 has an access aperture 33 positioned to expose a portion thereof. The space between the P-regions 14–1 and 30 is defined as the channel or conduction path of the P–MOS device 35. Overlying the channel and the P-N junctions at the channel ends is a gate insulator 36 which may be a relatively thin insulating or oxide layer as illustrated. Overlying the thin oxide layer is a gate metal 32.

The I/O arrangement of the present invention is flexible in application as it can be used in a number of different ways. The P-region 14–1 can be used as an input or output signal connector between the array 11 and the I/O pad 14. In addition, that portion of the gate metal 32 over thin oxide 36 which overlies the P-N junction formed by P-region 31 and the N-type substrate provides a surface-controlled avalanche or SCAT effect for the reverse breakdown voltage across the junction. Furthermore, the elongated P-region introduces resistance in series with the input terminal of the SCAT, thus protecting the junction from excessive currents when breakdown occurs.

Another feature of the I/O arrangement is that the P–MOS is available for use as a transmission gate to sample the input signal, as in dynamic or clocked systems. In such applications the signal is connected from I/O pad 14 to P-region 14–1. The gate 32 is connected to a clock signal line (not shown) operable to gate the signal via the conduction channel and P-region 30 to the array 11.

What is claimed is:

1. In an integrated circuit structure having a semiconductor substrate, an array of insulated gate field-effect devices formed on one surface of the substrate, said devices comprising, spaced apart regions of a different conductivity semiconductor, a layer of insulation overlying said surfrace and having apertures over and providing access for connections to said regions, a plurality of conductive bonding pads located at the periphery of said surface and supportably mounted thereon, an interconnect space disposed between said pads and array, said circuit structure comprising:

an insulated gate field-effect device located between at least one of said pads and the array, said device having a gate region insulated from the conduction channel disposed between and interconnecting first and second spaced apart regions of said different conductivity semiconductor, the gate region and channel being located adjacent the array with said first region being elongated and extending across the interconnect space with its end remote from the channel located adjacent one of said pads, whereby said device is adaptable for use as a transmission gate for coupling and sampling a signal and for simultaneously providing non-destructive breakdown protection for the array devices.

2. The invention according to claim 1 wherein said insulated gate field-effect device is one of a plurality of substantially similar devices located adjacent separate ones of said bonding pads.

3. The invention according to claim 2 wherein a layer of metal connectors overlies the insulating layer with selected connectors extending through the access apertures and making contact with the underlying elongated regions.

References Cited

UNITED STATES PATENTS

| | | | |
|---|---|---|---|
| 3,191,061 | 6/1965 | Weimer | 317—235 X |
| 3,383,570 | 5/1968 | Luscher | 317—235 |
| 3,414,740 | 12/1968 | Dailey et al. | 307—304 |
| 3,417,260 | 12/1968 | Foster | 307—213 |

JAMES D. KALLAM, Primary Examiner